United States Patent
Yang et al.

(10) Patent No.: US 7,467,448 B2
(45) Date of Patent: Dec. 23, 2008

(54) METHOD OF MANUFACTURING A PIEZOELECTRIC CERAMIC

(75) Inventors: Yong Suk Yang, Busam (KR); Su Jae Kim, Busam (KR); Jong Soo Kim, Busam (KR)

(73) Assignee: Key Sung Metal Co., Ltd. (KR)

( * ) Notice: Subject to any disclaimer, the term of this patent is extended or adjusted under 35 U.S.C. 154(b) by 628 days.

(21) Appl. No.: 11/128,763

(22) Filed: May 13, 2005

(65) Prior Publication Data

US 2005/0206276 A1    Sep. 22, 2005

Related U.S. Application Data

(63) Continuation of application No. PCT/KR02/02147, filed on Nov. 16, 2002.

(51) Int. Cl.
*H01L 41/22* (2006.01)
(52) U.S. Cl. .................. 29/25.35; 29/25.41; 29/832; 29/833; 29/844; 29/851
(58) Field of Classification Search ............... 29/25.35, 29/25.41, 832, 833, 844, 851, 830; 310/358, 310/330, 311, 332, 313 A
See application file for complete search history.

(56) References Cited

FOREIGN PATENT DOCUMENTS

| GB | 643448 | 9/1950 |
|---|---|---|
| JP | 59018189 A | 1/1984 |
| JP | 4076970 A | 3/1992 |
| JP | 5347438 A | 12/1993 |

OTHER PUBLICATIONS

International Search Report, Aug. 8, 2003, 2 pages.

*Primary Examiner*—Peter DungBa Vo
*Assistant Examiner*—Tai Nguyen
(74) *Attorney, Agent, or Firm*—Park & Associates IP Law LL (57) ABSTRACT

Disclosed are a piezoelectric ceramic structurally crystal-oriented through the crystallizing control of an amorphous material under an electric field and a method of manufacturing the same. The amorphous material is applied with an electric field to produce the crystal-oriented piezoelectric ceramic. The material is amorphous $Li_2B_4O_7$ consisting of $Li_2O$ and $B_2O_3$ in a ratio of 1:2, and is employed in information technology, device technology, mechanical technology and so forth.

1 Claim, 8 Drawing Sheets

Fig. 8

METHOD OF MANUFACTURING A PIEZOELECTRIC CERAMIC

This application is a continuation of pending International Patent Application No. PCT/KR2002/002147 filed Nov. 16, 2002, which designates the United States.

FIELD OF THE INVENTION

The present invention relates to a piezoelectric ceramic, and more particularly, to a piezoelectric ceramic structurally crystal-oriented through the crystallizing control of an amorphous material under an electric field and a method of manufacturing the same.

BACKGROUND ART

Generally, in view of the physical aspect, an amorphous material is characterized by the absence of long-range order appeared from a crystal, even though there may be a certain regularity of the structure on a local scale, i.e., short-range order. Solids having isotropy may be made from the structurally disordered amorphous to provide different properties resulted from a wide range of composition. In addition, if energy is applied to the amorphous, the crystallization is achieved through primary phase transition. If bulky amorphous is crystallized by the nuclear generation and growth, the material is changed into polycrystalline material with different axial directions of grains.

The crystal axes of grains within bulky ceramic material bulky are respectively oriented toward a different direction. In order to employ the ceramics having a piezoelectric property as a piezoelectric device, a polarizing direction of grains within a sample has to be oriented toward any one direction as much as possible. A polling method applying a direct-current electric field as high as possible is employed to orient a polarization. A dimension of the electric field is various depending upon physical property of the sample; however, the electric field of a range from a few kV/mm to several dozens kV/mm is required. The material to which the above method is applied is mainly ferroelectrics. A coupling coefficient indicative of the piezoelectric characteristics depending upon the distributing degree of the polarizing direction is related to the dimension of the electric field and an average size of grains, but does not exert effect upon a value of signal crystal.

Accordingly, if the electric field is applied in one direction to the material having the piezoelectricity during the crystallization of the amorphous material, the energy affecting ions, atoms or molecules in the applying direction of the electric field is larger than that applied in other directions, leading elements to be more activated. The growth of the crystal is more activated in the direction that polarization easily occurs and the electric field is identical, than other axis.

DISCLOSURE OF THE INVENTION

Therefore, an object of the present invention is to solve the problems involved in the prior art, and to provide a method of manufacturing a crystal-oriented ceramic by using a physical phenomenon.

Another object of the present invention is to provide a method of manufacturing a piezoelectric ceramic with a crystal axis oriented to one direction in a crystallizing course of an amorphous material, and a piezoelectric ceramic manufactured by the above method.

Another object of the present invention is to provide a method of manufacturing a ceramic having a piezoelectric effect next to a single crystal ceramic, and a piezoelectric ceramic manufactured by the above method.

According to the present invention, axes of bar-type grains are oriented in one direction, and a piezoelectric property of the oriented direction is improved in proportion to a single crystal ceramic. The present ferroelectric material may be employed in various fields such as a sensor, a filter, an actuator, an oscillator, a surface acoustic wave device and so forth. According to the present invention, the method of manufacturing the ceramic having the piezoelectric property using the amorphous material may be applied to non-ferroelectrics In addition, the present invention provides a new method of orienting the axes of bar-type grains in one direction by crystallizing the amorphous material under the electric field. In particular, the present invention remarkably improves the piezoelectric property of crystal-oriented ceramic in proportion to a single crystal ceramic. The method may be applied to various piezoelectric devices to improve the characteristics.

BRIEF DESCRIPTION OF DRAWINGS

The above objects, other features and advantages of the present invention will become more apparent by describing the preferred embodiment thereof with reference to the accompanying drawings, in which.

BEST MODE FOR CARRYING OUT THE INVENTION

Reference will now be made in detail to preferred embodiments of the present invention, examples of which are illustrated in the accompanying drawings.

According to the embodiment, an amorphous material is applied with a low alternating electric field, preferably 0.1 V/mm to 10 V/mm, and simultaneously, is crystallized to manufacture a piezoelectric ceramic crystal-oriented under the electric field, thereby obtaining a sample having a good piezoelectric effect.

If the method proposed by the present invention is made of not a ferroelectric material but a single crystal material, the sample shows a piezoelectric property. Accordingly, in the case of using other material not the ferroelectric material, the ceramic sample manufactured by the method according to the present invention also shows a good piezoelectric property.

Amorphous sample of $Li_2B_4O_7$ is prepared by mixing and melting $Li_2O$ and $B_2O_3$ in a ratio of 1:2 and flat-quenching the mixture. Gold used for an electrode is deposited on both widen surfaces of the amorphous sample of $Li_2B_4O_7$ having a thickness of 1.3 millimeters and an area $5\times10$ mm$^2$ by a sputtering method. The amorphous sample is applied with an electric field of a range from a few V/mm to several dozens V/mm (preferably, a range from 0.1 V/mm to 10 V/mm) at a frequency of 1 to 50 Hz, and is crystallized within an electric furnace of above 450° C. At that time, preferably, the applied frequency is 10 Hz, the applied electric field is 3.8 V/mm, and the temperature is 530° C.

The properties of amorphous piezoelectric ceramic of $Li_2B_4O_7$ manufactured by the above-mentioned method are shown in FIGS. 1 to 8.

Figure 1:
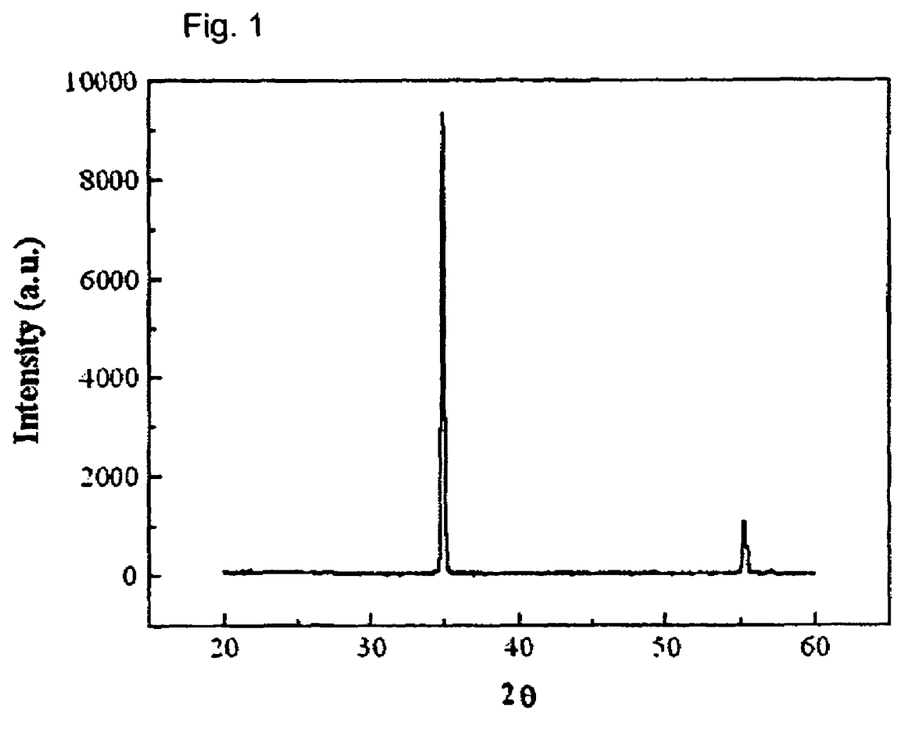
FIG. 1 is a graph showing an X-ray diffraction pattern of $Li_2B_4O_7$ ceramic crystallized under the electric field.

Specifically, FIG. 1 shows an X-ray diffraction pattern of the piezoelectric ceramic of $Li_2B_4O_7$ crystallized under the electric field. A plane of the sample is vertical to an incident X-ray at measuring the pattern. It would be understood that a peak having a scattering angle of 34.87° is corresponding to a (004) direction, and grains within the ceramic are well oriented relative to a crystal axis c. In addition, it would be understood that a peak having a scattering angle of 55.30° is corresponding to a (116) direction and grains within the ceramic are not oriented relative to any direction but are distributed to some degree. Since an angle formed by the crystal axes (004) and (116) is 13.260, grains within the sample are well oriented relative to a c-axis, with it having the distribution of the above angle. It would be understood that since the direction of the applied electric field is vertical to the plane of the sample, the c-axes of the grains are vertically oriented to the plane of the sample.

Figure 2:
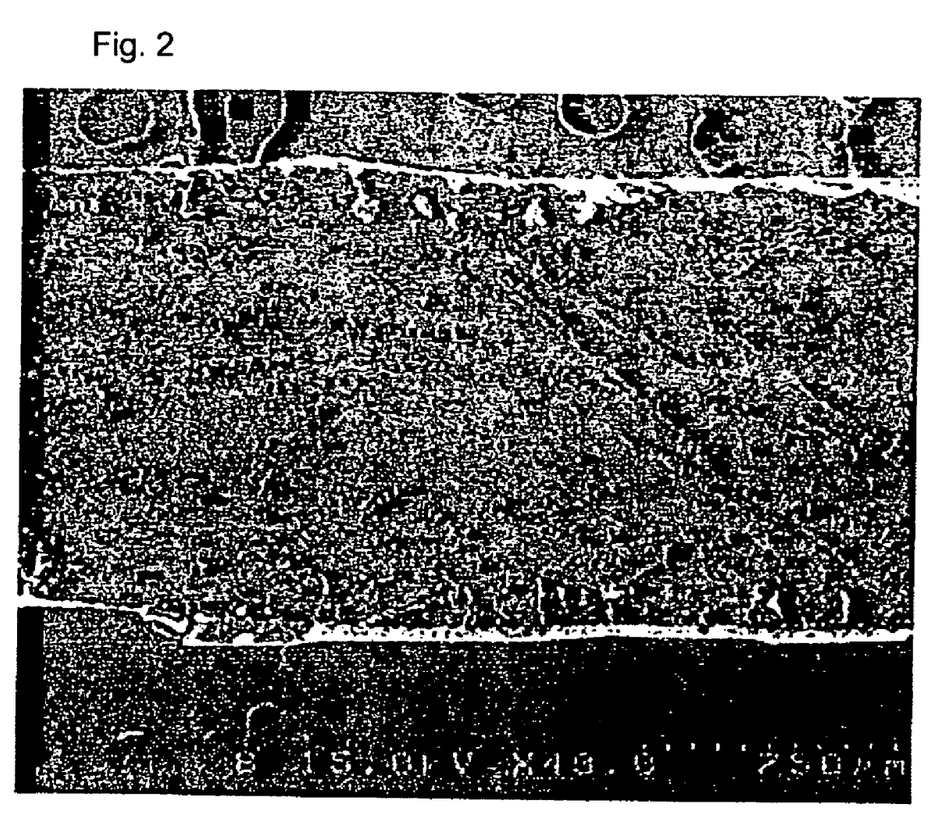
FIG. 2 is an SEM picture showing a cross section of an amorphous ceramic of $Li_2B_4O_7$ having a thickness of 1.3 mm according to the present invention.

FIG. 2 is an SEM picture showing a cross section of the amorphous ceramic of $Li_2B_4O_7$ having a thickness of 1.3 mm. Thin white portions formed on both surfaces are the gold electrodes deposited by the sputtering process to apply the electric field.

Figure 3:
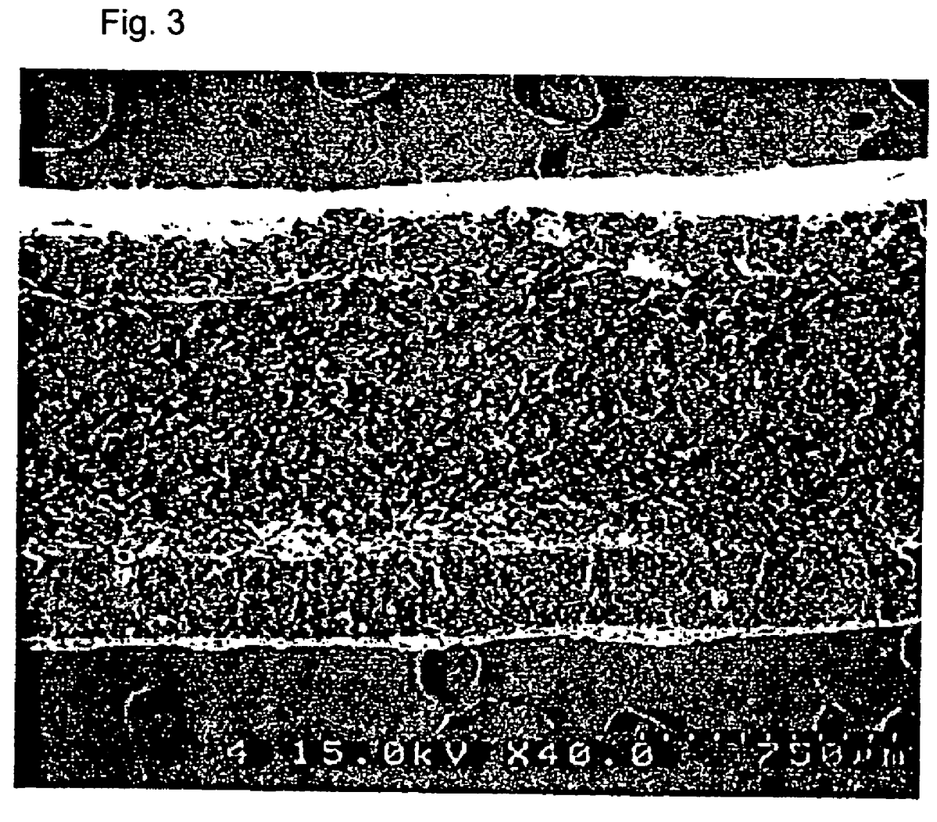
FIG. 3 is an SEM picture showing a partially crystallized portion at a temperature of 530° C. under an electric field of 3.8 V/mm according to the present invention.

FIG. 3 is an SEM picture showing partially crystallized pattern at a temperature of 530° C. under the electric field of 3.8 V/mm. It would be understood that the crystallization occurs over a region of a thickness of 140 µm from both surface. A size of the picture is 2,000 µm×2,900 µm.

Figure 4:
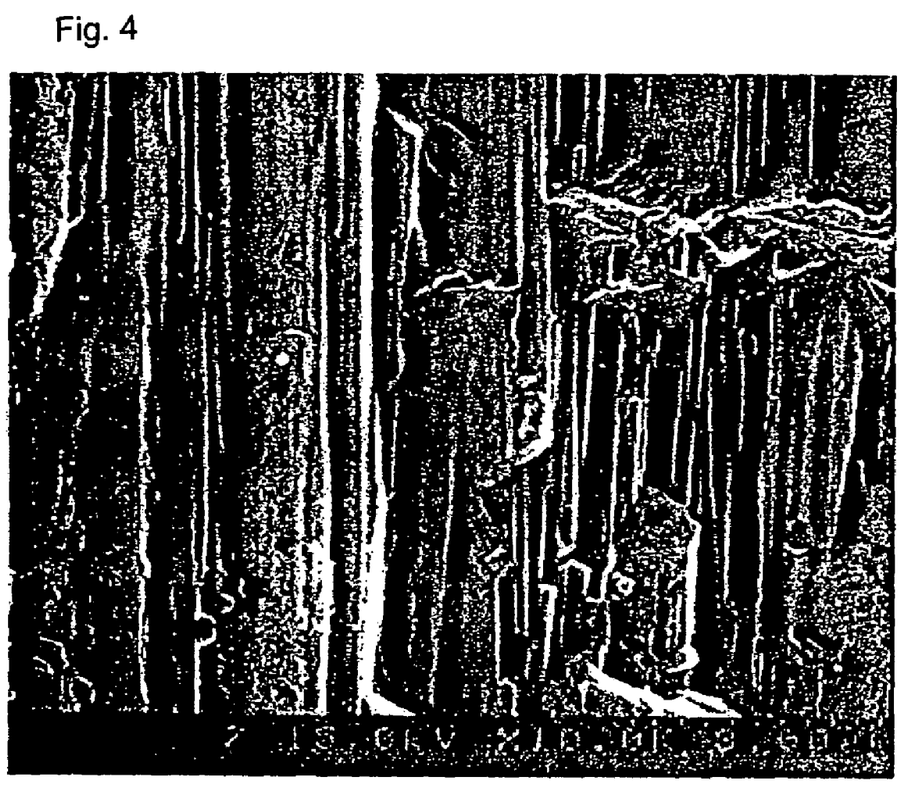
FIG. 4 is a magnified SEM picture of a crystallized portion according to the present invention.

FIG. 4 is a magnified SEM picture of the crystallized portion. It would be understood that all bar-like grains are oriented toward one direction. It is known from an X-ray diffraction test that a longitudinal direction of the bar is parallel to the direction of c-axis. A size of the picture is 8 µm×11.7 µm.

Figure 5:
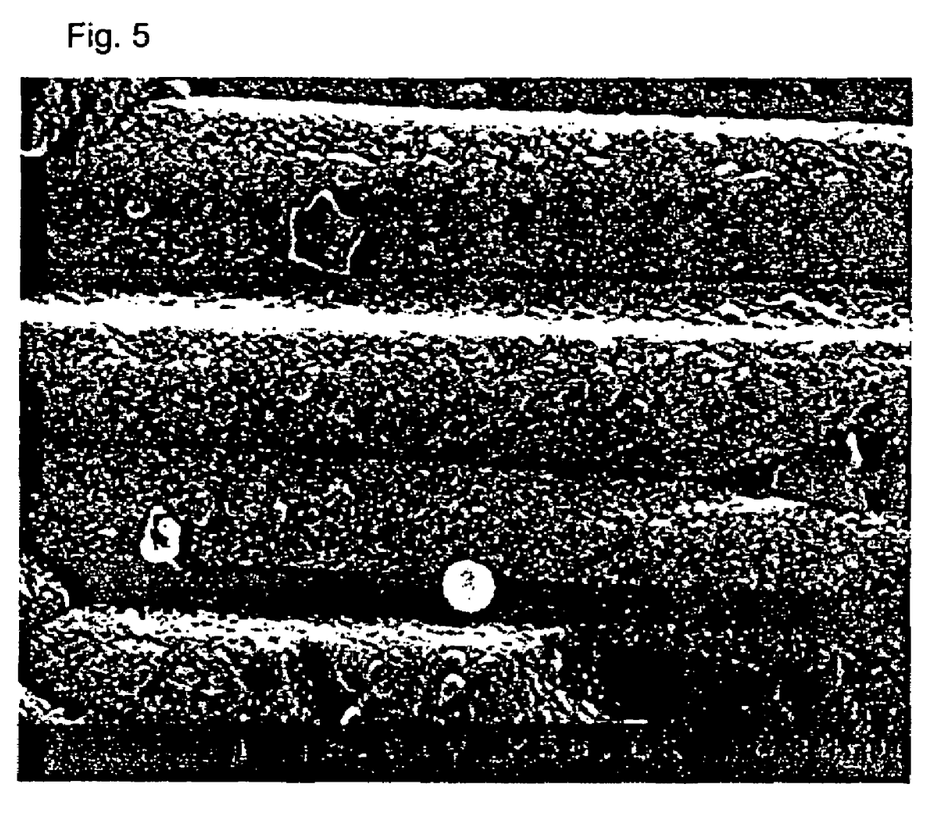
FIG. 5 is a magnified SEM picture of a crystallized sample according to the present invention.

FIG. 5 is a magnified SEM picture of the crystallized sample. It would be understood that all grains having a diameter of 250 nm to 500 nm are oriented toward one direction (c-axis). A size of the picture is 1.6 µm×2.3 µm.

Figure 6:
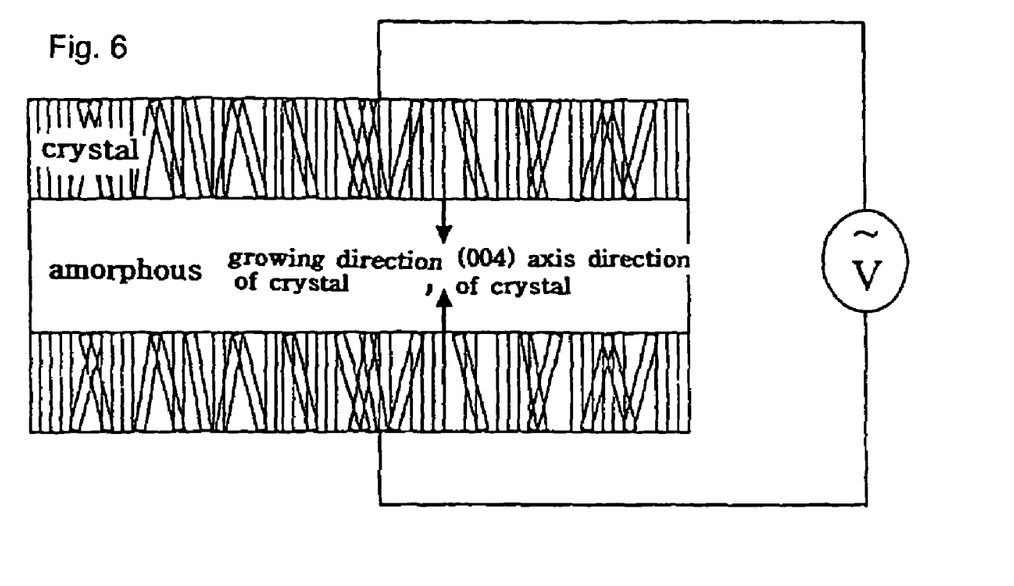
FIG. 6 is a schematic view of a growing direction of bar-like fine grains and a longitudinal direction of grains in the course of crystallization of amorphous $Li_2B_4O_7$ according to the present invention.

FIG. 6 is a schematic view of a growing direction of bar-like fine grains and a longitudinal direction of grains in the course of crystallization of amorphous ceramic of $Li_2B_4O_7$. It would be understood that a direction to which an alternating electric field is applied, a longitudinal direction of the bar-like grains and c-axis direction of the grains are identical to each other.

Figure 7:
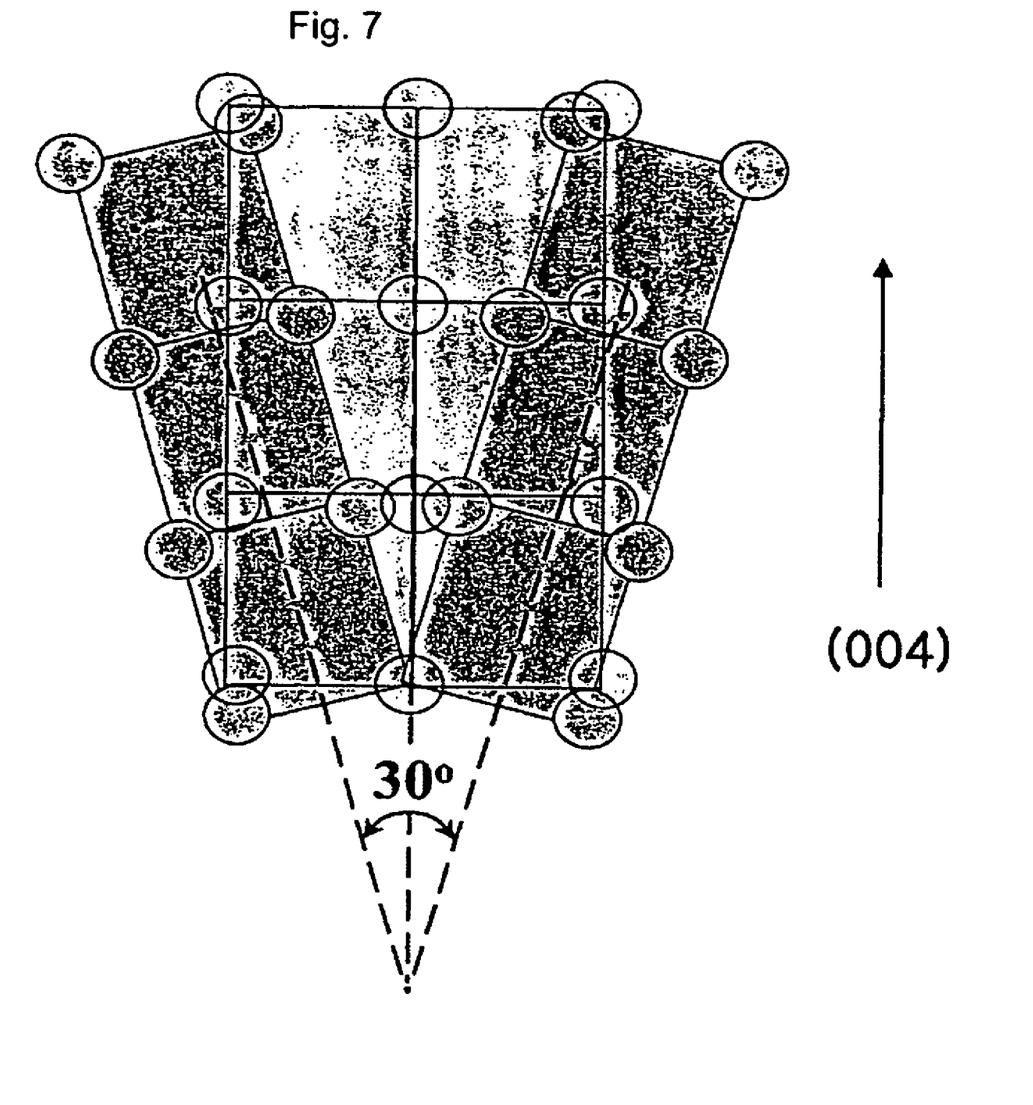
FIG. 7 is a schematic view showing distribution of bar-like grains relative to a c-axis, according to the present invention.

FIG. 7 is a schematic view showing the distribution of bar-like grains relative to a c-axis. Most of the bar-like grains are distributed within an angle of 15° relative to the c-axis.

Figure 8:
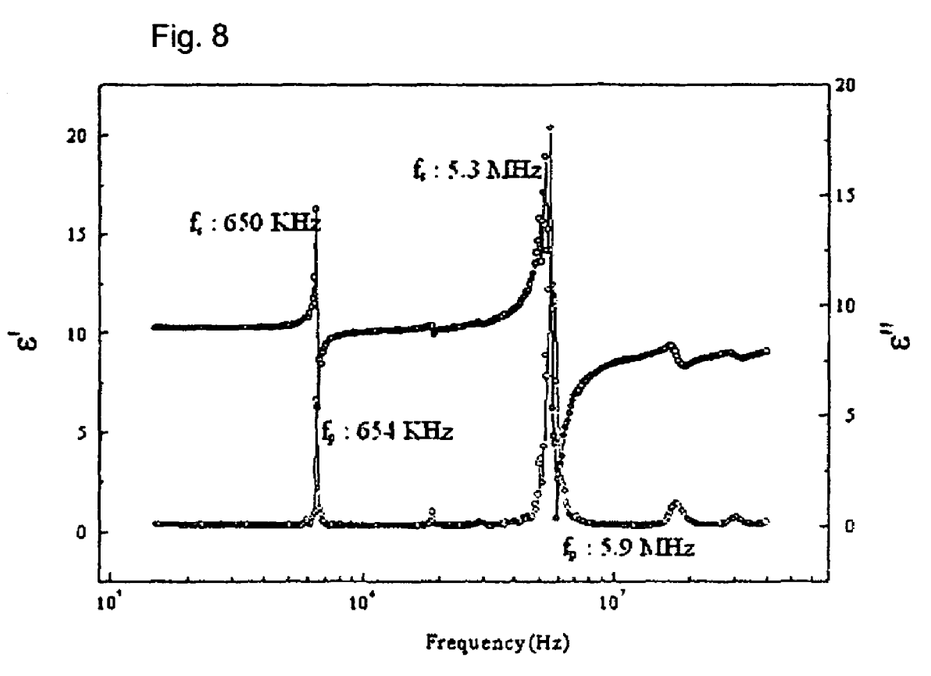
FIG. 8 is a graph showing the behavior of rear part and imaginary part of dielectric part at a resonant frequency showing when a disk-like sample having a thickness of 0.46 mm and a radius of 2.7 mm is oriented to a c-axis direction and an electric field is applied at the c-axis direction, according to the present invention.

FIG. 8 is a graph showing the behavior of rear part and imaginary part of dielectric part at a resonant frequency showing when a disk-like sample having a thickness of 0.46 mm and a radius of 2.7 mm is oriented to a c-axis direction and an electric field is applied at the c-axis direction.

According to the embodiment, the growth of the bar-like grains of $Li_2B_4O_7$ to an ab-plane is very restricted. The growing speed of the c-axis direction is 22 µm/min at 530° C., and the crystallization of a thickness of 1.3 mm is completed during about 30 minutes.

In addition, when the sample according to the embodiment is made in a shape of disk having a thickness of 0.46 mm and a radius of 2.7 mm and the electric field is applied in a direction of the c-axis, a longitudinal coupling factor is $k_r$=0.13 and a transverse coupling factor is $k_t$=0.48, thereby providing a piezoelectric effect in proportion to a single crystal of $Li_2B_4O_7$.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

INDUSTRIAL APPLICABILITY

As apparent from the above description, the present invention provides a new method of producing a material having a piezoelectric effect in proportion to a single crystal ceramic. The method may apply to non-ferroelectrics having a piezoelectric property in case of a single crystal and a ferroelectric ceramic having the piezoelectric effect by polling. In addition, the improved piezoelectric property of the ceramic produced by the above method may be employed in information technology, device technology, mechanical technology and so forth.

What is claimed is:

1. A method of manufacturing a piezoelectric ceramic, comprising the steps of:
   mixing and melting $Li_2O$ and $B_2O_3$ in a ratio of 1:2;
   flat-quenching the mixture to make amorphous $Li_2B_4O_7$;
   depositing gold on both surfaces of the amorphous $Li_2B_4O_7$ by a sputtering process, the gold used as an electrode;
   applying the amorphous $Li_2B_4O_7$ with an electric field of a range from 0.1 V/mm to 10 V/mm at a frequency of 1 to 50 Hz; and
   heating the amorphous $Li_2B_4O_7$ within an electric furnace of above 450° C., to crystallize the amorphous $Li_2B_4O_7$.

* * * * *